United States Patent

Waldhauer et al.

[11] Patent Number: 5,924,058
[45] Date of Patent: Jul. 13, 1999

[54] PERMANENTLY MOUNTED REFERENCE SAMPLE FOR A SUBSTRATE MEASUREMENT TOOL

[75] Inventors: Ann P. Waldhauer, La Honda; David K. Carlson, Santa Clara; Paul B. Comita, Menlo Park, all of Calif.

[73] Assignee: Applied Materials, Inc., Santa Clara, Calif.

[21] Appl. No.: 08/800,863

[22] Filed: Feb. 14, 1997

[51] Int. Cl.⁶ .................................................. G01R 31/265
[52] U.S. Cl. ...................... 702/170; 364/478.16; 324/719
[58] Field of Search ............................ 364/563, 567–568, 364/468, 478.16; 356/369, 382; 250/225; 324/719; 702/170

[56] References Cited

U.S. PATENT DOCUMENTS

| 5,321,634 | 6/1994 | Obata et al. | 364/563 |
| 5,511,005 | 4/1996 | Abbe et al. | 364/552 |
| 5,643,044 | 7/1997 | Lund | 451/15 |
| 5,698,989 | 12/1997 | Nulman | 324/719 |

*Primary Examiner*—Kamini Shah
*Attorney, Agent, or Firm*—Blakely Sokoloff Taylor & Zafman

[57] ABSTRACT

A method and apparatus for measuring a reference sample in order to collect a reference characteristic, without moving the reference sample, is disclosed. In one embodiment, the method of the present invention comprises the following steps. An operator places a cassette of unprocessed wafers into a processing chamber of a processing tool that also includes a holding chamber. While the wafers are being processed, the holding chamber, which is coupled to a measurement tool, measures the reference sample that is mounted on a stage in the holding chamber. The resulting reference characteristic value (e.g., spectrum to determine film thickness) is then stored in the measurement tool's computer system. After a film is grown/formed on the wafers, the processed wafers are moved one by one into the holding chamber to be measured. A first wafer is placed on the stage in the holding chamber and a characteristic value for the first processed wafer is obtained using the measurement tool. The computer system of the measurement tool uses an algorithm to compare the reference characteristic value to the first wafer characteristic value to obtain a first differential value. The first differential value is then used to help determine the characteristic (e.g., film thickness) of the film formed on the first processed wafer. In another embodiment, a similar process is followed to measure another characteristic of a wafer, such as resistivity. These examples are illustrative and not limiting. Thus, the present invention can be used whenever a reference sample is to be measured to help determine a selected characteristic of a substrate or wafer.

24 Claims, 6 Drawing Sheets

PERMANENTLY MOUNTED REFERENCE SAMPLE FOR A SUBSTRATE MEASUREMENT TOOL

BACKGROUND

1. Field of the Invention

The present invention relates generally to semiconductor manufacturing. More specifically, the present invention pertains to a reference sample mounted on a stage to allow convenient access to the reference sample during collection of a reference sample spectrum.

2. Description of Related Art

Figure 1A:
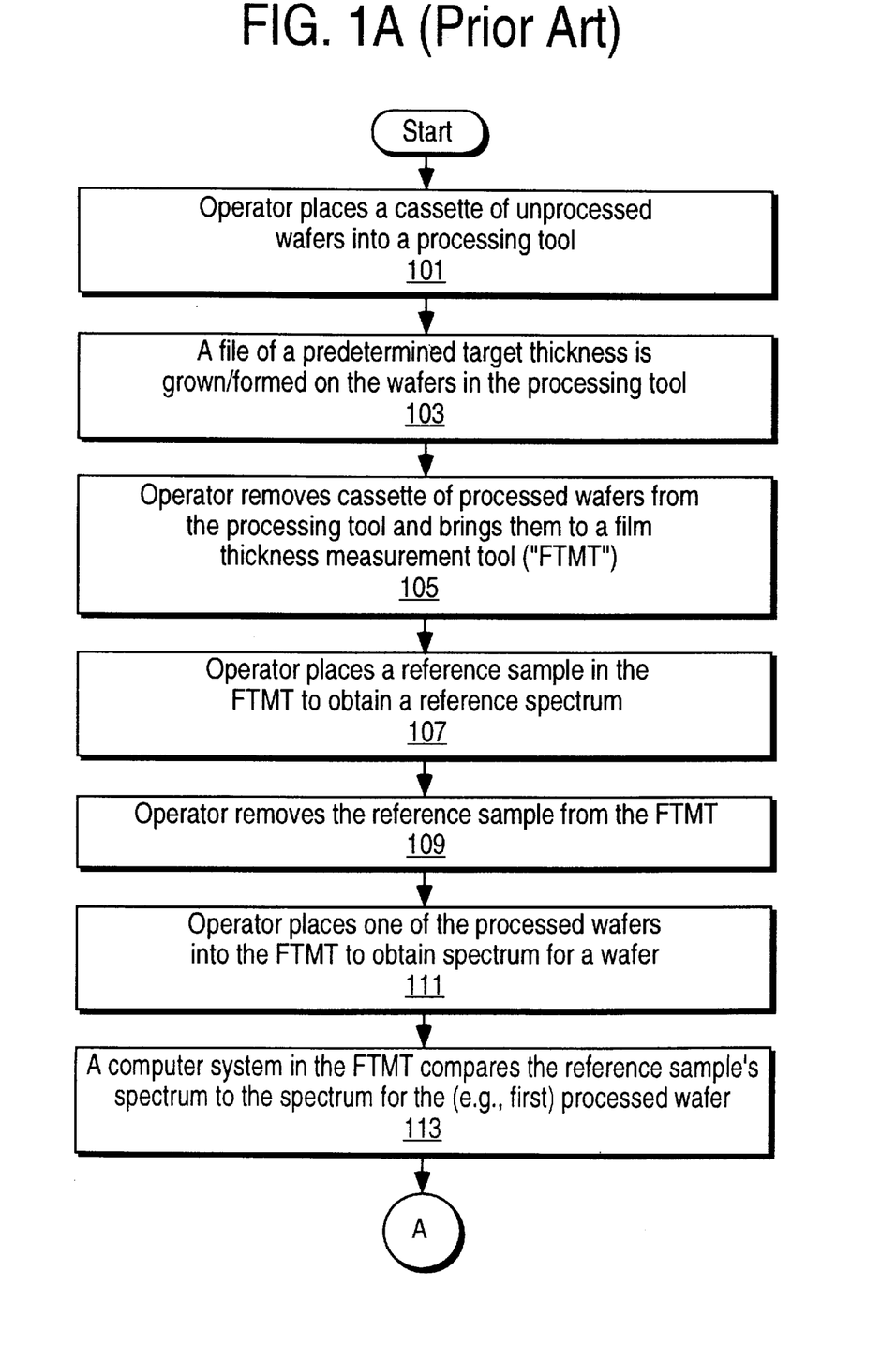
FIG. 1A is a flow chart of prior art method of measuring film thickness on a substrate.
Figure 1B:
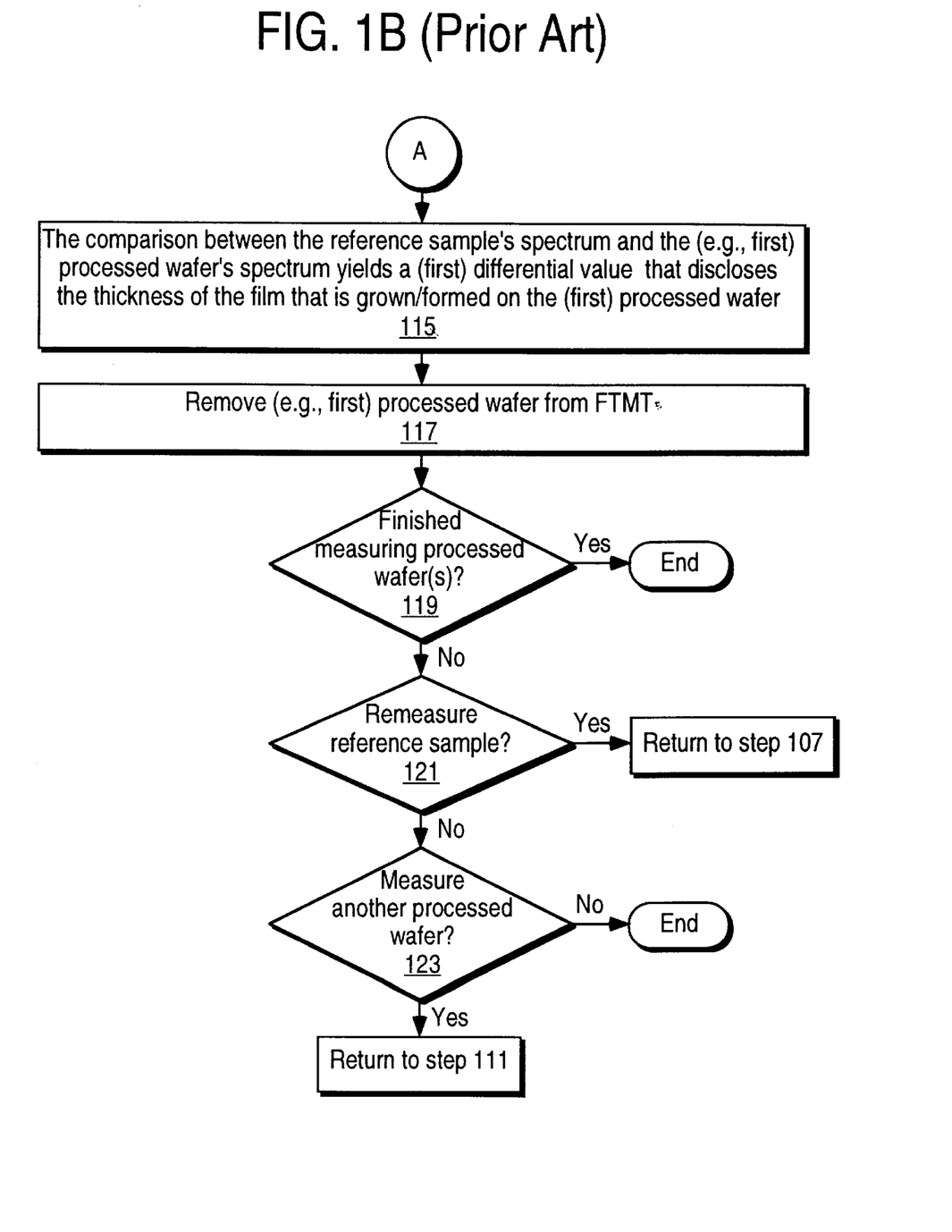
FIG. 1B is a continuation of the flow chart of FIG. 1A.

During the manufacturing of semiconductor devices, a film (e.g., an epitaxy or an oxide layer) is formed on a wafer surface. After the film is formed on the wafer, a characteristic of the film, such as film thickness is measured to determine if the desired film thickness is achieved. A flow chart of a prior art method of determining film thickness is illustrated in FIGS. 1A–B. Beginning with FIG. 1A and step 101, an operator places a cassette of unprocessed wafers into a processing tool. The processing tool typically has several chambers and each chamber performs a different function. For instance, the film is formed on the wafer in a processing chamber and in some cases, the wafer is then cooled in a holding or cooling chamber before it is removed from the processing tool. A film of a predetermined target thickness is grown/formed on the wafers in a processing chamber of the processing tool in step 103. In step 105, the operator removes the cassette of processed wafers from the processing tool and brings the cassette of processed wafers to a film thickness measurement tool. Because the operator removes the wafers from the processing tool before measuring the film thickness formed on the wafers and then measures the processed wafers in a separate measurement tool, this is an off-line process.

The operator, however, often places a reference sample in the film thickness measurement tool to obtain a reference spectrum in step 107, before measuring the spectrum of a processed wafer. Once the operator has obtained a reference spectrum for the reference sample, then in step 109, the operator removes the reference sample from the film thickness measurement tool. In step 111, the operator places one of the processed wafers (e.g., a first processed wafer) into the film thickness measurement tool to obtain a spectrum for that (e.g., first) processed wafer. The film thickness measurement tool typically uses infrared radiation that is directed toward the processed wafer and then reflected off the processed wafer to collect a spectrum for that particular wafer. In step 113, a computer system, which has already stored the reference sample's spectrum, compares the reference sample's spectrum to the (e.g., first) processed wafer's spectrum. In FIG. 1B and step 115, the comparison between the reference sample's spectrum and the first processed wafer's spectrum yields a first differential value that helps determine the thickness of the film on the (e.g., first) processed wafer.

In step 117, the operator removes the measured (first) processed wafer from the film thickness measurement tool. The operator, in decision diamond 119, must decide whether she or he is finished measuring processed wafers. If the answer is "yes", then the process ends. If on the other hand, the answer is "no", then the next step is decision diamond 121, where the operator must decide whether to remeasure the reference sample to collect another reference spectrum. If the operator decides to remeasure the reference sample, then the process returns to step 107, where the operator again places the reference sample in the film thickness measurement tool. The process repeats itself again from steps 107 through step 117 but with the replacement of a "second processed wafer" for a "first processed wafer." Step 107 through step 117 are repeated for each measured processed wafer. A spectrum for a particular processed wafer and a reference spectrum are necessary to determine the film thickness on that particular processed wafer.

If the operator decides not to remeasure the reference sample, then in decision diamond 123, the operator decides again whether to measure another processed wafer. If the answer is "no", the process ends. But if the answer is "yes", then the process returns to step 111. Once again, in steps 113, 115 and 117, "a (first) processed wafer" should be replaced with "a (second) processed wafer." The operator must place the reference sample in the film measurement tool each time before collecting the reference sample's spectrum and then remove the reference sample each time before measuring the processed wafer. Thus, an operator must handle the reference sample numerous times during the film thickness measurement process.

A process, similar to the flow chart shown in FIGS. 1A–1B, can be used to measure another film characteristic, such as film resistivity. Instead of a film thickness measurement tool, the operator uses a film resistivity measurement tool. The process of measuring film resistivity, however, also suffers from the same drawbacks.

Therefore, the prior art method of measuring the reference sample suffers from several disadvantages. First, there is a decrease in throughput as the placement of a reference sample in the measurement tool displaces a processed wafer. Second, increased operator handling of the reference sample and wafer leads to a greater incidence of handling or contamination errors. This is because the operator must handle the reference sample and wafer every time they are placed in the measurement tool and every time they are removed from the measurement tool. Third, there is a throughput decrease because of the impact on the processing tool or computer system each time the reference sample must be moved when a reference spectrum is collected.

Thus, it is desirable to have a method of measuring a reference characteristic without moving the reference sample on and off a stage in a measurement tool each time the reference sample is measured.

SUMMARY

The present invention describes a method and apparatus for easily measuring a reference sample that is disposed within a measurement tool. Because the reference sample can be mounted to a stage disposed within the measurement tool, in one embodiment, an operator does not need to transfer the reference sample to the measurement tool before collecting a reference spectrum. Thus, in one embodiment, the reference sample is available to be measured whenever the measurement tool is not measuring a substrate.

The present invention can be implemented as an in-line process in which the reference sample is disposed within a holding or evaluation chamber that is part of a larger process or cluster tool. The holding or evaluation chamber, in one embodiment, can include a film thickness measurement tool or a film resistivity measurement tool. In addition, the present invention can also be utilized as part of an off-line process in which the reference sample is disposed within a stand-alone measurement tool that is not coupled to a process chamber as part of a cluster tool. In other words, an operator must bring a processed substrate or wafer to the measurement tool in order to measure the processed substrate.

According to an in-line embodiment, the reference sample is permanently mounted to a stage of a holding chamber that is part of a processing tool. Permanently mounted does not mean that the reference sample cannot be removed, when necessary, from the holding chamber. Instead permanently mounted implies that the reference sample does not have to be reintroduced into the holding chamber each time before collecting a reference characteristic (e.g., resistivity of the reference sample).

In one embodiment, a substrate processing tool comprises a processing chamber, a holding chamber coupled to the processing chamber and a measurement tool coupled to the holding chamber. An operator places a cassette of substrates (e.g., wafers) into the processing chamber so that a film can be grown/formed on each substrate. While the holding chamber is empty, the measurement tool measures a reference sample that is mounted on a stage within the holding chamber to collect a reference characteristic (e.g., spectrum). After a film has formed on a substrate, the substrate is automatically transferred to the holding chamber. The measurement tool is then used to measure a characteristic of the substrate. A computer system, coupled to the measurement tool in one embodiment, compares the reference sample's characteristic value to the substrate's characteristic value to obtain a differential value that helps determine a characteristic of the film formed on the substrate, such as film thickness.

One advantage of a permanently mounted reference sample is that the reference sample can be easily and conveniently measured whenever a substrate is not being measured in the holding chamber. This enables the reference spectrum to correct for instrumental drift over time and thus, helps avoid inconsistencies in measuring the film thickness of the substrates when the characteristic measured is film thickness. This general principle also applies when the characteristic measured is film resistivity. Moreover, the permanently mounted reference sample does not negatively impact throughput because the reference sample does not otherwise occupy a production cassette slot and therefore, does not displace a substrate. In addition, there is no adverse effect on the substrate handling hardware or computer system because the operator does not need to move the reference sample before and after each reference sample measurement.

BRIEF DESCRIPTION OF THE DRAWINGS

The present invention is illustrated by way of example and not a limitation in the figures of the accompanying drawings in which like references indicate similar elements. In addition, some of the elements in the figures are not drawn to scale and may appear larger for the sake of clarity.

DETAILED DESCRIPTION

A method and apparatus is described for conveniently measuring a permanently mounted reference sample to collect a reference spectrum. In the following description, numerous specific details are given to provide a thorough understanding of the invention. It will, however, still be apparent to one skilled in the art that the invention may be practiced without these specific details. Moreover, in some instances, well-known semiconductor equipment and processes have not been set forth in detail in order not to unnecessarily obscure the present invention.

The present invention allows the reference sample to be readily available so that an operator does not need to transfer the reference sample to a stage prior to measuring and collecting the reference spectrum or the reference's resistivity. It is to be appreciated that the present invention can also be used for measuring and collecting other characteristics of the reference sample. The present invention provides several advantages over the prior art. First, the reference sample does not occupy a production cassette slot that would otherwise be occupied by a wafer. Therefore, there is no negative impact on wafer throughput due to the reference sample. Second, there is no negative impact on the wafer handling hardware or computer because the reference sample does not need to be removed before or after a measurement. In addition, the present invention allows easy and convenient measurement of the reference sample before measuring a processed substrate or wafer without impacting throughput. Thus, for example, the reference spectrum can be easily updated so that inconsistencies in the film thickness results are avoided. Finally, because the reference sample can be part of the measurement tool, it is possible for the computer software to measure the reference sample automatically without ever requiring an operator do so explicitly.

Figure 2:
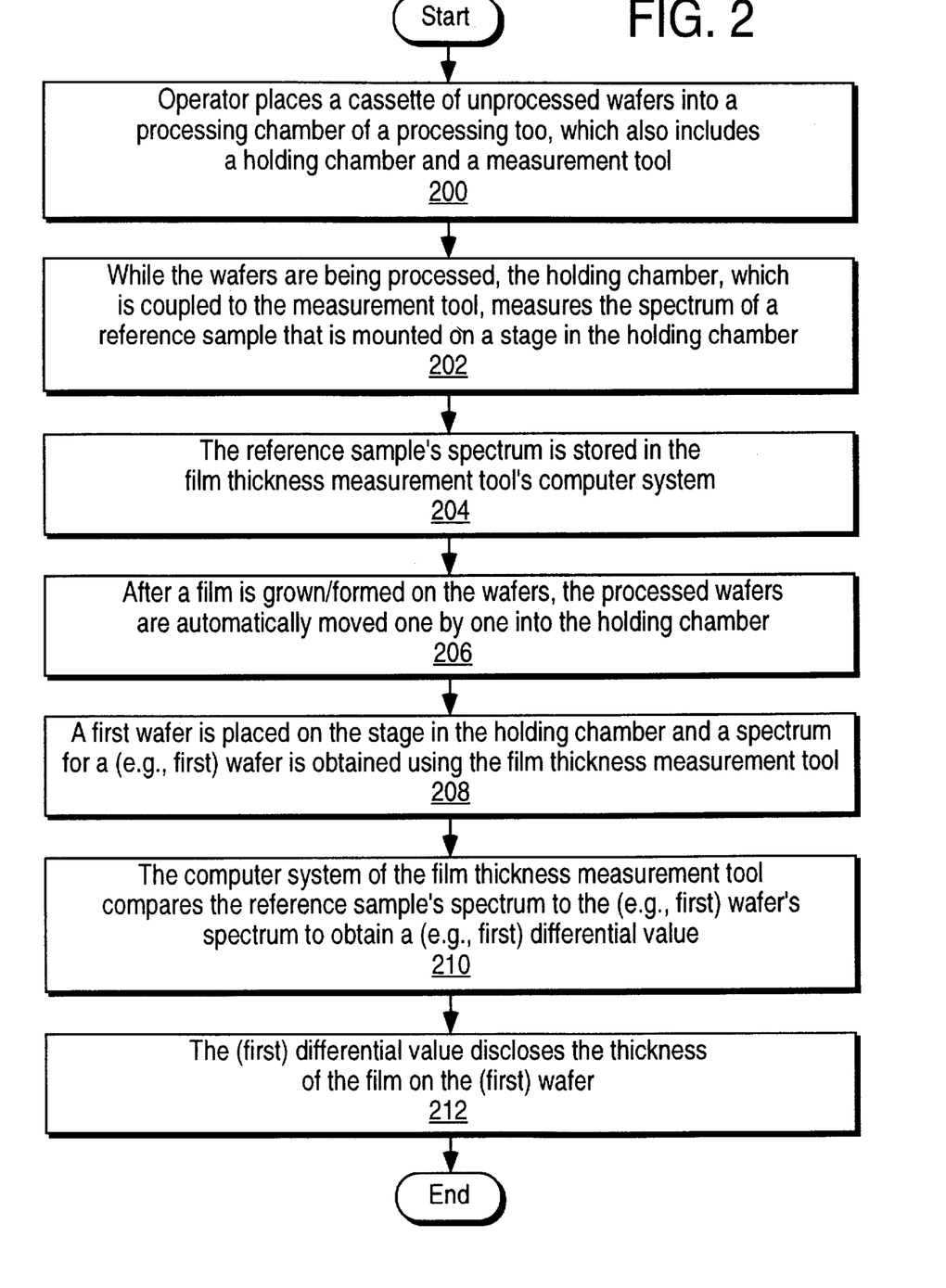
FIG. 2 is a flow chart illustrating an exemplary in-line embodiment of the present invention.

One embodiment of an exemplary in-line process for measuring film thickness utilizing the present invention is illustrated in a flow chart in FIG. 2. In step 200, an operator places a cassette of unprocessed wafers into a processing chamber of a processing tool. In one embodiment, the processing tool is an Epi Centura, which is manufactured by Applied Materials of Santa Clara, Calif. 95051. While the wafers are being processed, in step 202, the holding chamber, which is coupled to a measurement tool, measures (e.g., optically) the spectrum of a reference sample (using the film thickness measurement tool). The reference sample is mounted on a stage in the holding chamber and does not occupy a production slot in a cassette as in the prior art. In one embodiment, the reference sample can be a piece of silicon or any reflective surface that does not have the same film thickness as the processed wafer. This is because the reference sample's spectrum needs to be distinguishable from the processed wafer's spectrum in order to determine the wafer's film thickness. In step 204, the reference sample's spectrum is stored in the measurement tool's computer system. In one embodiment, the film thickness measurement tool is a Fourier Transform Infrared Radiation (FTIR) film thickness monitor that is manufactured by On-Line Technologies, Ltd., located in East Hartford, Conn. 06108.

After a film has grown/formed on the wafers, the processed wafers can be automatically moved one by one from the processing chamber into the holding chamber in step 206. The film formed can be selected from an exemplary group consisting of epitaxy, undoped polysilicon, doped and undoped capped polysilicon and silicon geranium. This list of possible films is meant to be illustrative and not limiting.

In step 208, a first wafer is placed on the stage in the holding chamber and a spectrum for the first wafer is obtained using the measurement tool. When the spectrum for the first wafer is being collected, the measurement tool does not measure the reference sample. It is to be appreciated that in another embodiment, the measurement tool may measure the first wafer and the reference sample simultaneously on different stages. In step 210, the computer system of the measurement tool uses an algorithm which is well-known in the art to compare the reference sample spectrum to the first wafer spectrum to obtain a first differential value. The algorithm used may vary depending on different factors, such as the kind of reference sample used. It will be apparent that the computer system of the processing tool can also be used to make the comparison between the two spectra. In step 212, the first differential value helps determine the thickness of the film formed on the first processed wafer.

The measurement tool can be programmed to automatically remeasure the reference sample to collect another reference spectrum after the first processed wafer is removed from the measurement tool. Or the measurement tool can be programmed to remeasure the reference sample periodically after a preselected interval of time has passed (e.g., every four hours). In addition, in one embodiment, a second processed wafer may be measured and placed in the measurement tool after the first wafer is removed. If the reference spectrum is remeasured, then this updated reference spectrum is used by the computer system to compare with the second wafer spectrum in determining the film thickness formed on the second wafer. If a new reference spectrum is not collected, the computer system compares the second wafer spectrum to the original reference spectrum in order to measure the film thickness formed on the second wafer. Thus, an operator can program the measurement tool to eventually measure each processed wafer from the cassette.

The measurement of the reference spectrum is affected by environmental variables such as, the temperature in the lab or the humidity of the lab in which the measurement tool is placed. Therefore, an operator may choose to remeasure the reference sample before measuring another processed wafer because the measuring conditions for the wafer need to be similar to the measuring conditions for the reference sample to accurately measure the wafer's film thickness. The thinner the film formed on the wafer (e.g., less than a micron) then the greater the need to remeasure the reference sample's spectrum. For example, if the film formed on the wafer is less than a micron, the software for the measurement tool can be set to automatically measure the reference sample in-between each measurement of a processed wafer. It is to be appreciated that the present invention is not limited to measuring the film thickness on a wafer but is also applicable to films formed on other substrates. In addition, the present invention can also be used with a different measurement tool that measures another characteristic, such as film resistivity according to a capacitance—voltage method. It will also be apparent that the present invention can be used as part of a processing tool in which films of different thicknesses are formed in separate processing chambers of the processing tool.

Figure 3:
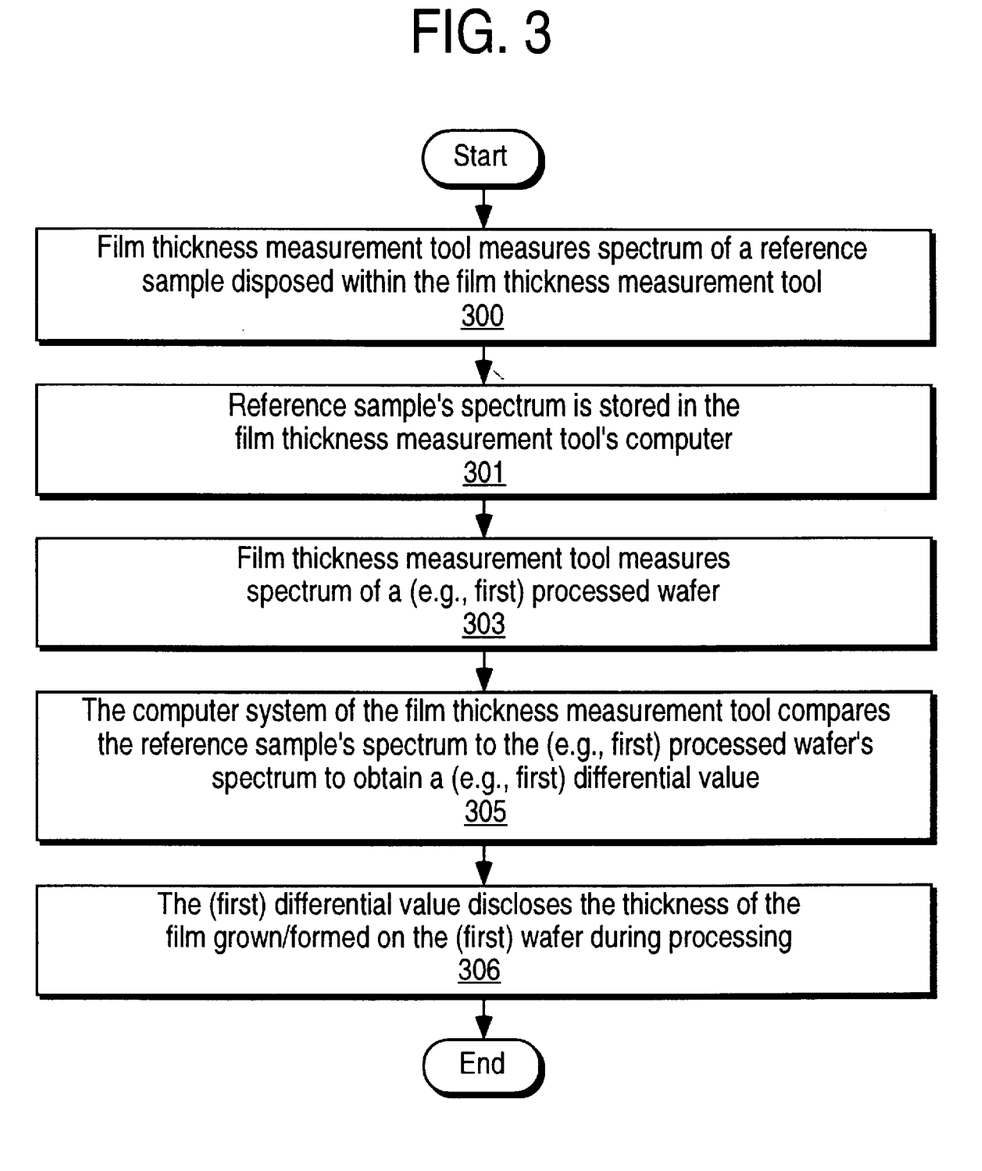
FIG. 3 is a flow chart illustrating an exemplary off-line embodiment of the present invention.

FIG. 3 illustrates a flow chart of an exemplary off-line embodiment for measuring film thickness using the present invention. In step 300, the film thickness measurement tool measures the spectrum of a reference sample that is already disposed within the film thickness measurement tool. The reference sample can be a piece of silicon or any reflective surface that does not have the same film thickness as the processed wafer to be measured. In a preferred embodiment, the stage of the measurement tool can be cut so that a slight recess for the reference sample is created in the stage. In step 301, the reference sample's spectrum is stored in the measurement tool's computer system. An operator then brings a processed wafer to the measurement tool and places it on the stage. When the processed wafer is on the stage, the measurement tool, in one embodiment, does not measure the reference sample. In step 303, the measurement tool measures the spectrum of a (e.g., first) processed wafer. The computer system of the measurement tool, in step 305, uses an algorithm, which is well-known in the art, to compare the reference sample's spectrum to the (e.g., first) processed wafer's spectrum to obtain a (e.g., first) differential value. In step 307, the (first) differential value helps determine a thickness of the film that is grown/formed on the (first) wafer during processing. The process now ends for the measurement of the film thickness of the first processed wafer.

If a second wafer is to be measured, then the first processed wafer is removed from the measurement tool's stage. A second wafer is then placed on the stage of the measurement tool. The measurement tool measures the spectrum of the second processed wafer. The computer system of the measurement tool compares the reference sample spectrum to the second processed wafer spectrum to obtain a second differential value. The second differential value helps determine the thickness of the film grown or formed on the second wafer. The computer system can be set to automatically measure the reference sample to obtain an updated reference spectrum between wafer measurements in the measurement tool or periodically after a predetermined interval of time. If an updated reference spectrum is collected before measuring the second wafer, then the computer system compares the updated reference spectrum to the second wafer spectrum in order to obtain the second differential value. It is to be appreciated that a similar flow chart applies to measuring another characteristic, such as film resistivity according to the present invention.

Figure 4:
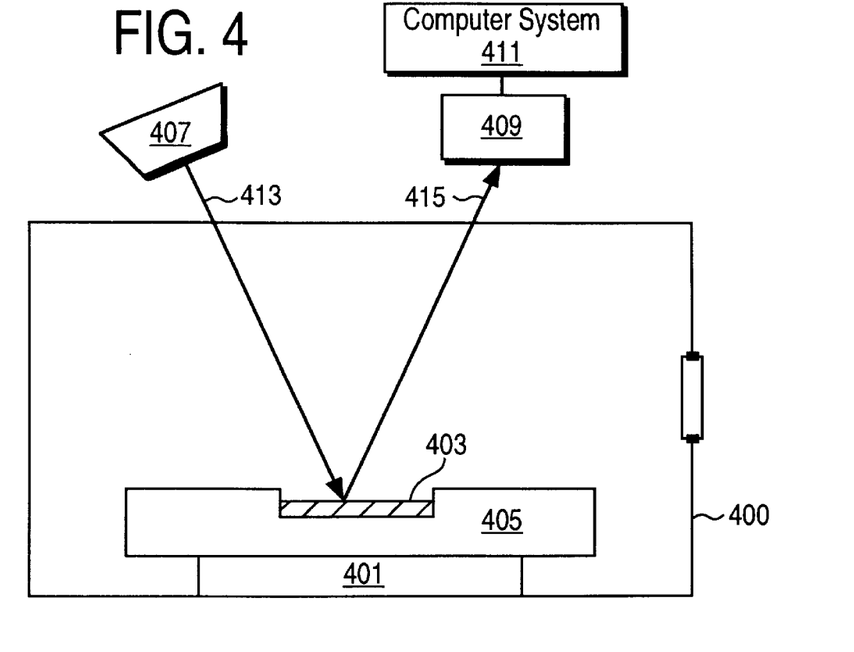
FIG. 4 illustrates one embodiment for measuring film thickness using the present invention.

One embodiment of the present invention for measuring film thickness is illustrated in FIG. 4. The holding chamber 400 can be a cool-down chamber that is part of a substrate or cluster processing tool, such as the Epi Centura or the Polycide Centura, which are both manufactured by Applied Materials of Santa Clara, Calif. 95051. Both exemplify an in-line metrology. In contrast, in an off-line metrology, the holding chamber 400 is a stand-alone film thickness measurement tool that is not part of a cluster tool, such as the Epi Centura. A reference sample 403 rests in the recess of a chuck 405 that is part of a stage 401 disposed within the holding chamber 400. A source 407 provides a light signal, such as infrared radiation, that passes through a wall in chamber 400 to the reference 403. The light signal 413 directed to the reference sample 403 is then reflected 415 back to a detector 409. The detector 409 is coupled to a computer system 411. The reference sample cannot be set too deep in stage 401 because the distance 413 between the source 407 and the reference sample 403 must be close to the distance 504 of FIG. 5 between the source 407 and a wafer 502 for an accurate measurement. The computer system 411 includes a storage device for storing a reference spectrum and the spectrum from each processed wafer that is measured. In addition, the computer system 411 includes a processor with an algorithm for comparing the reference sample's spectrum with each substrate's or wafer's spectrum.

Although the source and detector are shown outside the holding chamber in FIG. 4, it is to be appreciated that the source 407 and the detector 409 can also be located within the holding chamber 400. In addition, source 407 and detector 409 do not have to be in a fixed position as shown in FIG. 4. Furthermore, the computer system 411 can be part of the measurement tool, which includes holding chamber 400 or it can be part of a larger cluster or processing tool, such as the Epi Centura.

Figure 5:
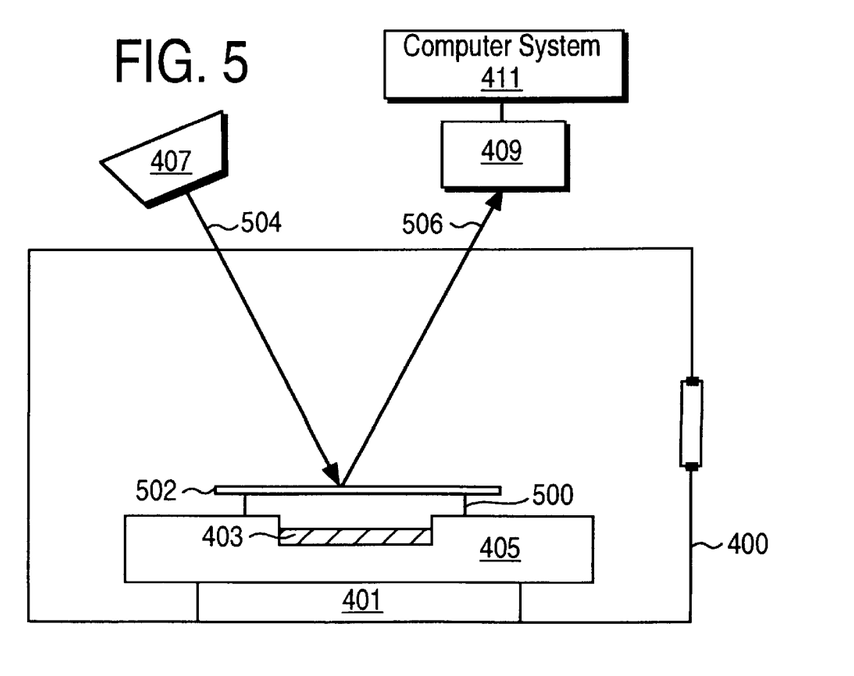
FIG. 5 illustrates another embodiment for measuring film thickness using the present invention.

Another embodiment of the present invention is illustrated in FIG. 5. A wafer 502 is resting on pins 500 so that the back of the wafer does not touch the reference sample 403 that is recessed within the chuck 405. When the wafer is in the holding chamber 400, the source 407 projects a light signal 504 on the wafer 502 which is then reflected 506 back to a detector 409. The detector is coupled to computer system 411. The computer system 411 can be part of the holding chamber 400 as part of an off-line metrology or as part of a larger wafer processing tool that includes the holding chamber 400 for an in-line metrology. If the holding chamber 400 is part of a stand-alone measurement tool, then the computer system 411 is part of the measurement tool. But if holding chamber 400 is part of a larger processing tool, then computer system 411 can be part of the larger processing tool or part of the measurement tool. The detector 409 collects the spectrum resulting from the reflected light signal 506 received from the wafer 502. The computer system 411 then uses an algorithm loaded on its processor to compare the reference's 403 spectrum to the wafer's 502 spectrum in order to obtain a differential value. The algorithm can be, for example, a ratio that compares the reference's spectrum and the wafer spectrum to obtain the differential value. This differential value helps determine the thickness of the film formed on the wafer 502.

Figure 6:
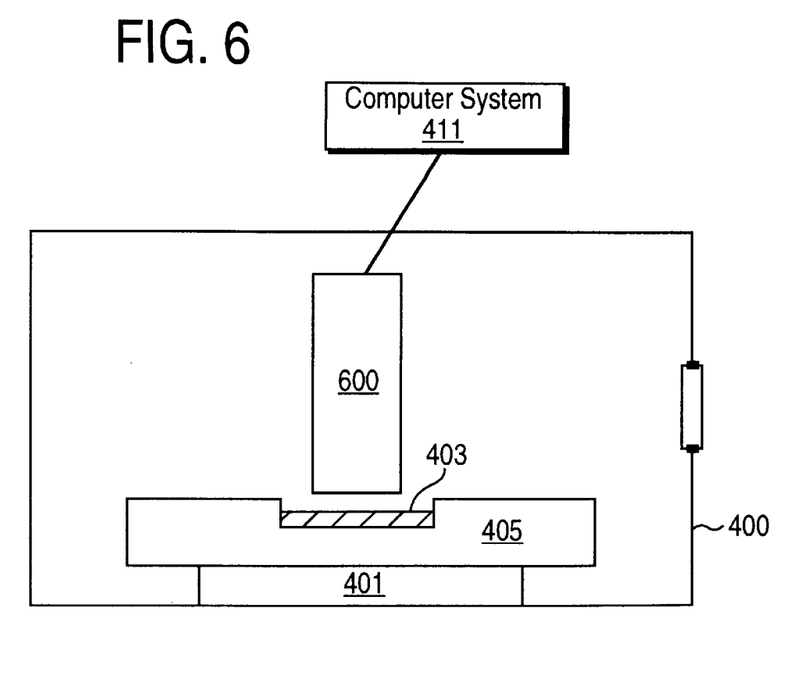
FIG. 6 illustrates an embodiment for measuring film resistivity.

One embodiment of the present invention that can be used for measuring film resistivity is shown in FIG. 6. The holding chamber 400 can be part of a cool-down chamber that is part of a substrate or a cluster processing tool in an in-line metrology. Or the holding chamber 400 can be a stand-alone film resistivity measurement tool that is not part of a larger clustered tool, such as the Epi Centura. As similarly shown in FIGS. 4–5, a reference sample 403 rests in the recess of a chuck 405 that is part of a stage 401 disposed within the holding chamber 400. In one embodiment, the reference sample 403 can be a piece of silicon or any reflective surface that does not have the same characteristics as the processed wafer. A film resistivity measurement tool 600 that is nondestructive of the wafer and the reference sample 403 is used to measure the resistivity of the reference sample 403. The film resistivity measurement tool 600 can use, for example, a capacitance-voltage method, which is well-known in the art to measure the resistivity of the reference sample 403. The film resistivity measurement tool 600 can be coupled to computer system 411. The computer system 411 includes the storage device for storing the resistivity of the reference sample 403 and the resistivity from a processed wafer that is measured. In addition, computer system 411 includes a processor that runs an algorithm for comparing the reference sample's resistivity with the resistivity of a substrate or a wafer. The purpose of the comparison is to determine the resistivity of the wafer or substrate.

Figure 7:
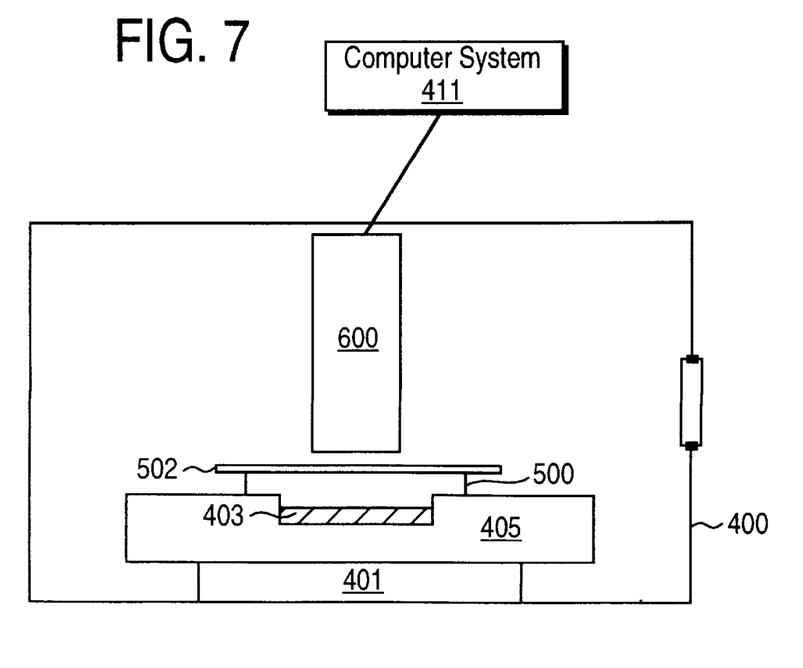
FIG. 7 illustrates another embodiment for measuring film resistivity.

Although the film resistivity measurement tool 600 is shown inside the holding chamber 400 in FIGS. 6 and 7, it is to be appreciated that the film resistivity measurement tool 600 can also be located outside the holding chamber 400. Furthermore, although film resistivity measurement tool 600 is shown in FIGS. 6–7 as not touching reference sample 403 or wafer 502 during a measurement, it 600 can touch reference sample 403 or wafer 502 during a measurement in another embodiment. In addition, the placement of reference sample 403 is preferably close to the placement of the wafer or substrate to be measured in order to obtain an accurate measurement and comparison of the wafer's resistivity to the reference's resistivity.

FIG. 7 is similar to FIG. 6, except that FIG. 7 illustrates the film resistivity measurement tool 600 measuring a wafer 502 that is resting on pins 500. The wafer or substrate 502 rests on pins 500 so that back of the wafer 502 does not contact the reference sample 403 to avoid possible contamination. The computer system in FIG. 6 is similar to the computer system 411 illustrated in FIG. 7. In addition, FIGS. 6 and 7 parallel FIGS. 4 and 5. The only difference is that the film characteristic measured in FIGS. 4 and 6 is film thickness while the film characteristic measured in FIGS. 6 and 7 is film resistivity. In either case, a permanently mounted reference sample provides the same advantages. For example, the reference sample does not occupy a production cassette slot that would otherwise be occupied by a wafer. In addition, there is no negative impact on the wafer handling hardware or computer because the reference sample does not need to be removed before or after a measurement of the reference sample or of the wafer. Thus, the present invention allows easy and convenient measurement of the reference sample, regardless of the characteristic to be measured, before measuring the processed wafer or substrate without negatively impacting throughput.

In the above description, numerous specific details or examples are given to be illustrative and not limiting of the present invention. Thus, the present invention is not limited to measuring the film characteristics of film thickness and film resistivity. It will also be apparent to one skilled in the art that the invention may be practiced without these specific details. Moreover, in some instances, well-known semiconductor equipment and processes have not been set forth in detail in order not to unnecessarily obscure the present invention. Thus, the method and apparatus of the present invention is defined by the appended claims.

We claim:

1. A substrate processing tool, comprising:

a processing chamber for forming a film on a substrate;

a holding chamber, coupled to said processing chamber;

a stage within said holding chamber, said stage being adapted for holding said substrate at a first location in the holding chamber;

a measurement tool coupled to said holding chamber, wherein the measurement tool measures a characteristic of said film formed on said substrate while said substrate is located on said stage in said holding chamber; and a reference sample located at a second location, which is different from the first location, in said holding chamber.

2. The substrate processing tool of claim 1, wherein said measurement tool is capable of measuring said reference sample and said substrate to obtain a characteristic value for said reference sample and said substrate after a film is formed on said substrate.

3. The substrate processing tool of claim 2, wherein said measurement tool includes a computer system that is capable of comparing said reference sample's characteristic value to said substrate's characteristic value to determine the characteristic of said film on said substrate.

4. The substrate processing tool of claim 1, wherein said reference sample is a piece of silicon coupled to a stage of said holding chamber, and said substrate is a wafer.

5. The substrate processing tool of claim 1, wherein said measurement tool includes a source of infrared radiation and a detector coupled to the source of infrared radiation, wherein the detector measures a spectrum that results from reflecting the source of infrared radiation off a surface of an object.

6. The substrate processing tool of claim 5, wherein said object is said reference sample when said substrate is not in said holding chamber.

7. The substrate processing tool of claim 5, wherein said object is said substrate when said substrate is in said holding chamber.

8. The substrate processing tool of claim 1, wherein said measurement tool is measuring the characteristic of film resistivity of said reference sample and said substrate.

9. The substrate processing tool of claim 1, wherein said characteristic of said film is selected from a group consisting of film resistivity and film thickness.

10. A film thickness measurement tool, comprising:
   a computer system that includes a storage device for storing a reference spectrum and a substrate spectrum, and a processor for comparing said reference spectrum with said substrate spectrum;
   an evaluation chamber;
   a stage within the evaluation chamber, said stage being adapted to hold a substrate at a first location within the evaluation chamber;
   a reference sample at a second location, which is different from said first location within said evaluation chamber;
   a source, coupled to said computer system and said reference sample, said source providing a light signal to the reference sample at said second location when a substrate is not in the evaluation chamber, but said source providing the light signal to said substrate when said substrate is located at said first location on said stage in said evaluation chamber; and
   a detector, coupled to said computer system, for collecting and providing said reference spectrum to said computer system when the light signal reflects off said reference sample, and for collecting and providing said substrate spectrum to said computer system when the light signal reflects off said substrate, said computer system being capable of comparing said reference spectrum with said substrate spectrum.

11. A film thickness measurement tool, comprising:
   a holding chamber;
   a source of light;
   a detector, coupled to the source of light, for detecting a reflected source of light;
   a chuck, located within the holding chamber, having a reference sample disposed within it, said chuck is disposed below said source and said detector, wherein said reference sample is located at a first location and reflects back a reference spectrum of said source of light to said detector when a substrate is not placed on the chuck, wherein said chuck is capable of supporting a substrate that is disposed over said reference sample so that said substrate is located at a second location which is different from the first location and does not contact said reference sample, said substrate is capable of reflecting back said source of light to said detector when said substrate is at said second location; and
   a computer system, coupled to said source of light and said detector, said computer system is capable of storing and comparing said reference spectrum with a plurality of substrate spectrum, wherein each substrate spectrum corresponds to a particular substrate in order to measure a film thickness associated with said particular substrate.

12. A method of measuring a film characteristic of a film formed on a substrate using a measurement tool in which a reference sample is disposed within said measurement tool, said method comprising:
   measuring a reference spectrum of said reference sample using said measurement tool while said reference sample is located within a holding chamber;
   storing said reference spectrum;
   inserting a first substrate into said holding chamber;
   measuring a first substrate spectrum of said first substrate using said measurement tool while said reference sample is located within the holding chamber;
   comparing said reference spectrum to said first substrate spectrum value to obtain a first differential value; and
   using said first differential value to determine said film characteristic formed on said first substrate.

13. The method of claim 12, further including the steps of:
   removing the first substrate from the holding chamber;
   remeasuring said reference sample to obtain an updated reference spectrum;
   storing said updated reference spectrum;
   inserting a second substrate into said holding chamber;
   measuring a second substrate spectrum of said second substrate to obtain a second substrate spectrum while said reference sample is located within the holding chamber;
   comparing said updated reference spectrum to said second substrate spectrum to obtain a second differential value; and
   using said second differential value to determine said film characteristic of the film formed on said second substrate.

14. The method of claim 13, wherein said film characteristic is film thickness.

15. The method of claim 13, wherein said film characteristic is film resistivity.

16. The computer-implemented method of claim 12, wherein the step of comparing said reference spectrum to said first substrate spectrum includes using an algorithm to compare differences between said reference spectrum and said first substrate spectrum.

17. The computer-implemented method of claim 13, wherein the step of comparing said updated reference spectrum to said second substrate spectrum includes using an algorithm.

18. The computer-implemented method of claim 12, further including the steps of:
   measuring a second substrate to obtain a second substrate spectrum;
   comparing said reference spectrum to said second substrate spectrum to obtain a second differential value; and
   using said second differential value to determine said film characteristic of the film formed on said second substrate.

19. A method of measuring a film characteristic of a film formed on a substrate, comprising:

forming a film on a first substrate;

measuring a reference sample disposed in a holding chamber;

collecting a reference sample spectrum;

inserting said first substrate into the holding chamber;

measuring said first substrate to obtain a first substrate spectrum while said reference sample is within the holding chamber;

comparing said reference sample spectrum to said first substrate characteristic value utilizing an algorithm; and obtaining a first differential value from said step of comparing said reference sample spectrum to said first substrate spectrum.

20. The method of claim 19, further including the step of:

using said first differential value to help determine said film characteristic of said first substrate.

21. The method of claim 20, wherein said film characteristic is film thickness.

22. The method of claim 20, wherein said film characteristic is film resistivity.

23. The method of claim 19, further including the step of:

remeasuring said reference sample at predetermined time intervals.

24. The method of claim 19, further including the step of:

remeasuring said reference sample after measuring said substrate.

* * * * *